United States Patent [19]

Biwa

[11] 4,390,810
[45] Jun. 28, 1983

[54] SEMICONDUCTOR LIGHT-EMITTING DISPLAY DEVICE

[75] Inventor: Takeshi Biwa, Mizumaki, Japan

[73] Assignee: Tokyo Shibaura Denki Kabushiki Kaisha, Kawasaki, Japan

[21] Appl. No.: 162,512

[22] Filed: Jun. 24, 1980

[30] Foreign Application Priority Data

Jul. 9, 1979 [JP] Japan .................................. 54/85895

[51] Int. Cl.³ ...................... H05B 33/04; H01L 33/00
[52] U.S. Cl. ........................................ 313/500; 357/80
[58] Field of Search ................... 313/512, 500; 357/80, 357/72, 74

[56] References Cited

U.S. PATENT DOCUMENTS

| 3,760,237 | 9/1973 | Jaffe | 313/512 X |
| 3,786,499 | 1/1974 | Jankowski et al. | 313/500 X |
| 4,058,750 | 11/1977 | Schöberl | 313/512 X |
| 4,312,116 | 1/1982 | Moser et al. | 357/80 X |

Primary Examiner—Palmer C. Demeo
Attorney, Agent, or Firm—Finnegan, Henderson, Farabow, Garrett and Dunner

[57] ABSTRACT

A semiconductor light-emitting display device comprising a casing having a display portion, a light-emitting assembly housed in the casing, and a resin layer sealing the gap between the casing and the light-emitting assembly. The casing is provided with a resin reservoir serving to store the resin flowing toward the display portion through the gap. The resin reservoir prevents the flowing resin from reaching the display portion.

7 Claims, 11 Drawing Figures

SEMICONDUCTOR LIGHT-EMITTING DISPLAY DEVICE

BACKGROUND OF THE INVENTION

This invention relates to a semiconductor light-emitting display device, particularly, to a device sealed with resin for protection of the semiconductor light-emitting elements.

A conventional semiconductor light-emitting display device sealed with resin is constructed as shown in, for example, FIG. 1 appended hereto. It is seen that the display device comprises a light-emitting assembly 16 housed in a casing 10. A predetermined portion of one wall of the casing 10 is formed of a transparent material so as to constitute a display portion 14 and the casing 10 is open to the outside on the side opposite to said one wall so as to provide an opening 12. The light-emitting assembly 16 consists of a stem 18, a plurality of light-emitting diodes 20, i.e., semiconductor light-emitting elements, and a plurality of terminals 22 connected to the diodes 20. The stem 18 is somewhat smaller than the opening 12 because the stem is inserted into the casing 10 through the opening 12. As seen from the drawing, the light-emitting diodes 20 are mounted to one surface of the stem 18 and the terminals 22 to the opposite surface of the stem 18. Further, a reflector 24 serving to guide the light emitted from the diodes to the display portion 14 are provided between the stem 18 and the display portion 14.

It is important to note that the diode 20 tends to be damaged by moisture, waterdrops, gases, etc. In order to prevent the damage, a liquid resin 26, which is solidified later, is poured into the casing 10 through the opening 12. Naturally, the gap between the stem 18 and the casing 10 shown in FIG. 1 is filled with the resin 26 and sealed after solidification of the resin. It follows that the moisture, waterdrops, gases, etc. are prevented from entering the casing 10 and, thus, the light-emitting diodes 20 are not damaged.

However, the conventional device described above gives rise to a serious drawback. Specifically, the liquid resin filling the gap between the stem 18 and the casing 10 tends to flow into the casing 10 before gelation. The flow of resin is particularly serious at the four corners of the gap. In some cases, the resin flowing into the casing 10 reaches the display portion 14 as shown in FIG. 2, markedly impairing the appearance of the produced light-emitting display device. Naturally, the display device stained with resin must be discarded. Since about 1 to 10% of the produced devices are stained with resin, the conventional device is low in productivity.

The flow of resin may be prevented if the gap between the stem and the casing is made very small. However, if the gap is too small, it is difficult or impossible in some cases to insert the stem into the casing. It should also be noted that the stem 18 is produced by punching, with the result that the corner portions of the stem are unavoidably rounded to some extent. In contrast, the casing 10 is produced by molding and, thus, the corner portions of the casing are scarcely rounded. It follows that the gap in question is enlarged at the corner portions, leading to the flow of resin even if the size of the gap is optimum except the corner portions.

The flow of resin can certainly be prevented by adjusting the properties of the resin such as viscosity, thixotropic property and time of gelation. However, a resin very suitable for preventing the flow into the casing may fail to fill the gap satisfactorily, rendering it impossible to prevent the moisture, etc. from entering the casing.

It is also possible to employ a double casting method for preventing the flow of resin 26 into the casing 10. In the double casting method, a small amount of resin is injected into the peripheral portion of the stem 18. After the resin mentioned has been cured, another resin injecting operation is applied to the entire region of the gap between the stem 18 and the casing 10. Clearly, this method necessitates an additional resin injection step, leading to a longer manufacturing time and, thus, to a low productivity.

SUMMARY OF THE INVENTION

An object of this invention is to provide a semiconductor light-emitting display device free from flow of a sealing resin to the display portion and, thus, high in productivity.

According to this invention, there is provided a semiconductor light-emitting display device, comprising:

a casing having a display portion formed in one wall thereof and an opening provided on the side opposite to the display portion, said display portion being formed of a transparent material;

a light-emitting assembly housed in the casing and comprising at least one semiconductor light-emitting element;

a reflector disposed between the light-emitting assembly and the display portion of the housing for guiding the light emitted from the semiconductor light-emitting element to the display portion; and a resin layer sealing the gap between the light-emitting assembly and the casing for protecting the semiconductor light-emitting element from the external environment, wherein the casing is provided with a resin reservoir serving to store the resin flowing through the gap between the light-emitting assembly and the casing in sealing the gap with the resin, thereby preventing the flowing resin from reaching the display portion.

DETAILED DESCRIPTION OF THE PREFERRED EMBODIMENTS

Figure 1:
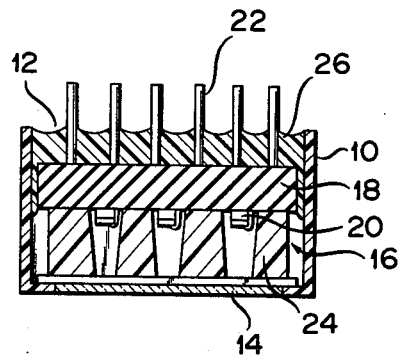
FIG. 1 shows a cross sectional view of a conventional semiconductor light-emitting display device.
Figure 2:
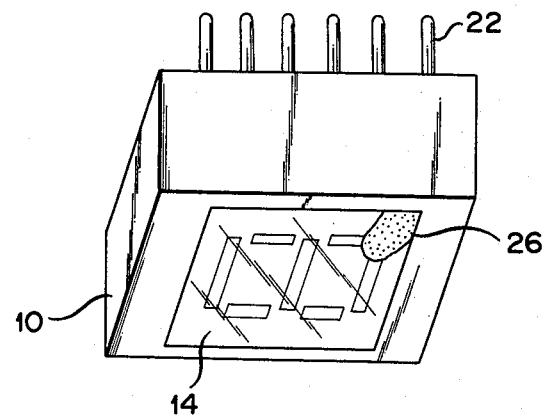
FIG. 2 shows an oblique view of the device shown in FIG. 1.
Figure 3:
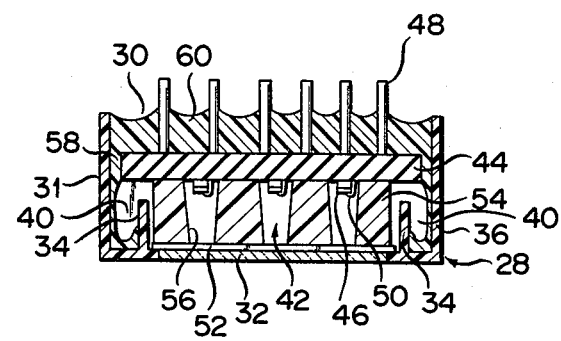
FIG. 3 shows a cross sectional view of a semiconductor light-emitting display device according to one embodiment of this invention.
Figure 4A:
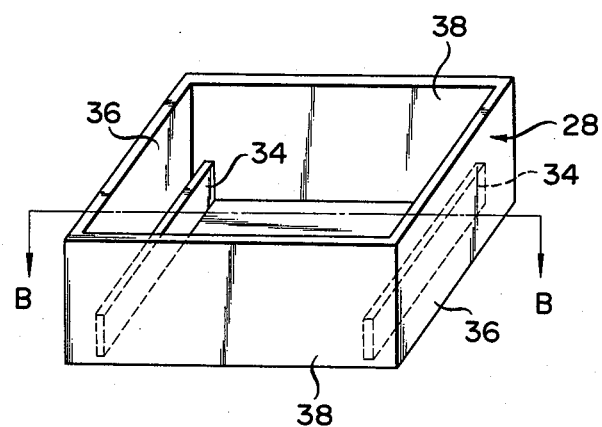
FIG. 4A shows an oblique view of the casing of the device shown in FIG. 3.
Figure 4B:
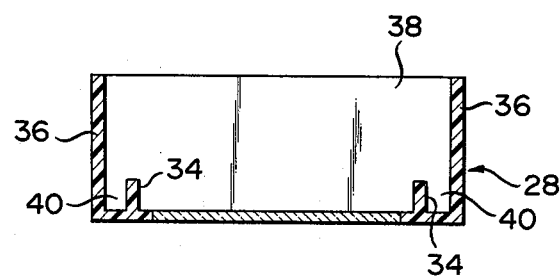
FIG. 4B shows a cross sectional view along the line B—B of FIG. 4A.

FIG. 3 shows a semiconductor light-emitting display device according to one embodiment of this invention. Like the conventional device shown in FIG. 1, the device shown in FIG. 3 comprises a light-emitting assembly 42 housed in a casing 28. A predetermined portion of one wall of the casing 28 is formed of a transparent material so as to constitute a display portion 32 and the casing 28 is open to the outside on the side opposite to said one wall so as to provide an opening 30. As clearly seen from FIGS. 4A and 4B, a pair of partition walls 34 are mounted within the casing 28 in a manner to form a pair of resin reservoirs 40 together with walls of the casing 28. Specifically, each partition wall 34 is spaced from and parallel with a side wall 36 of the casing 28 and is fixed to the bottom wall (or, "one wall" mentioned above) of the casing. Further, the front and rear faces of the partition wall are allowed to abut against the front and rear walls 38 of the casing, respectively. In other words, the resin reservoir 40 mentioned above is defined by the partition wall 34, side wall 36, front and rear walls 38 and bottom wall of the casing 28. Incidentally, the side wall 36 is shorter in general than the front or rear wall 38.

The light-emitting assembly 42 comprises a stem 44, a plurality of light-emitting diodes 46, i.e., semiconductor light-emitting elements mounted to one surface of the stem 44, and a plurality of terminals 48 mounted to the other surface of the stem 44 and connected to the light-emitting diodes 46. The stem 44, which is of a thin plate form, is somewhat smaller than the opening 30 of the casing 28 because it is inserted into the casing through the opening 30. The diodes 46 are fixed to the stem 44 via a silver paste and electrically connected to the terminals 48; namely the diodes 46 are connected to the terminals 48 via lead wires 50 and patterned metal layers formed in the stem 44. Incidentally, the diodes 46 are formed of a GaP or GaAsP semiconductor material and arranged in a seven-segment form.

A light-scattering film 52 consisting of, for example, polyester is formed on the inner surface of the display portion 32 of the casing 28. Further, a reflector 54 serving to guide the light emitted from the diodes to the display portion 33 are provided between the light-scattering film 52 and the stem 44. The reflector 54 is formed of a white plastic material such as polycarbonate or ACS and is provided with holes 56 which are arranged in a seven-segment form, and in which are disposed the light-emitting diodes 46. Incidentally, the outer surface of the display portion 32 is roughened at the peripheral portion for decreasing the transparency.

As described previously, the stem 44 is somewhat smaller than the opening 30 of the casing 28, with the result that a gap 58 is formed along the inner surfaces of walls of the casing 28. A liquid resin 60, which is solidified later, is injected into the casing 28 for filling and sealing the gap 58. It is possible to use either thermosetting or cold-setting resin for sealing the gap 58. For the case of using a thermosetting resin, it is necessary to select resin having a curing temperature of, for example, 100° C. or less in view of the resistance to heat of the plastic material forming the reflector 54. In the resin injection step, the resin may possibly flow through the gap 58, particularly the corner portions thereof, toward the display portion 32 of the casing 28. But, the flowing resin is prevented from reaching the display portion 32 because it is stored in the resin reservoir 40.

Figure 5A:
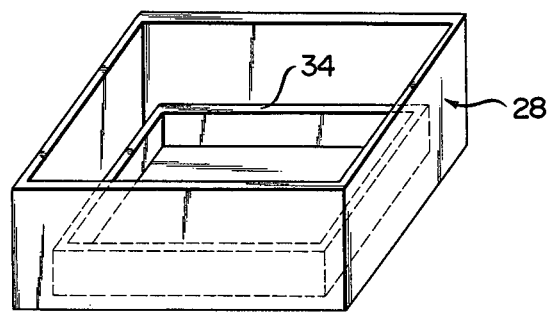
FIG. 5A shows an oblique view of the casing of a device according to another embodiment of this invention.
Figure 5B:
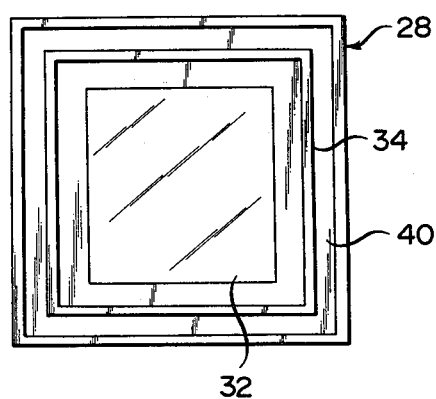
FIG. 5B shows a plan view of the casing shown in FIG. 5A.
Figure 6A:
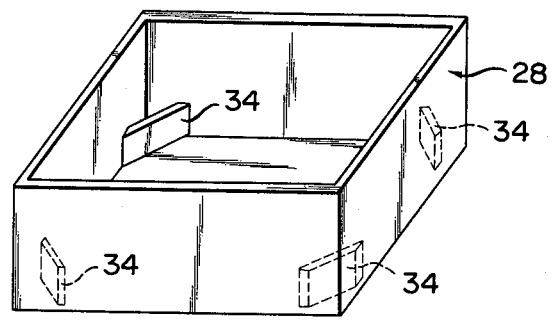
FIG. 6A shows an oblique view of the casing of a device according to another embodiment of this invention.
Figure 6B:
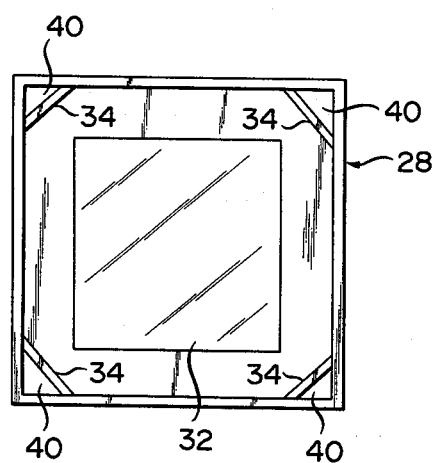
FIG. 6B shows a plan view of the casing shown in FIG. 6A.
Figure 7A:
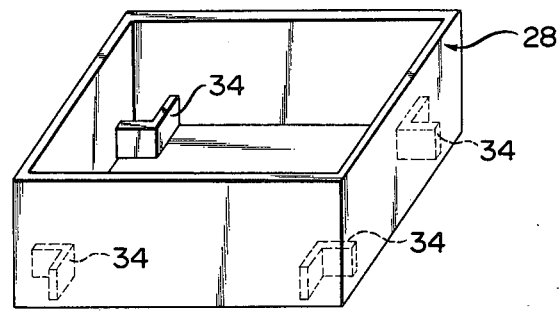
FIG. 7A shows an oblique view of the casing of a device according to still another embodiment of the invention.
Figure 7B:
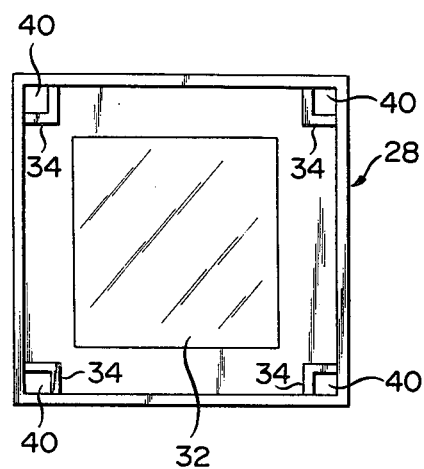
FIG. 7B shows a plan view of the casing shown in FIG. 7A.

In the embodiment described above, a pair of partition walls 34 is used for forming a pair of resin reservoirs 40 covering the four corner portions of the casing 28. But, the partition wall 34 may be provided such that the resin reservoir 40 extends along the inner surfaces of the walls of the casing as shown in FIGS. 5A and 5B. It is also possible to provide the partition walls 34 in a manner to form the resin reservoirs 40 at the four corner portions of the casing as shown in FIGS. 6A, 6B, 7A and 7B. In the embodiment of FIGS. 6A and 6B, each resin reservoir 40 is triangular in cross section, whereas each reservoir 40 has a square cross section in the embodiment of FIGS. 7A and 7B. As a matter of fact, the resin flows through, particularly, the corner portions of the gap 58 because the corner portions are unavoidably wider than the other portion. Thus, it practically suffices to form the resin reservoir in a manner to receive the resin flowing through the corner portions alone of the gap 58.

As described above in detail, the semiconductor light-emitting display device of this invention comprises a resin reservoir serving to store the resin flowing toward the display portion through the gap between the light-emitting assembly and the casing in the step of sealing the gap with the resin. Thus, the flowing resin is prevented from reaching the display portion without fail, rendering it impossible for the display portion to be stained with resin. It should also be noted that the gap in question can be sealed by a single resin injection, namely, a sufficient amount of resin can be injected by a single operation, because the resin reservoir serves to prevent the display portion from being stained with resin. Thus, the resin can be injected easily in a short time, leading to a high productivity of the semiconductor light-emitting display device.

What is claimed is:

1. A semiconductor light-emitting display device, comprising:
   a casing having a display portion formed in a bottom wall thereof, side walls defining a predetermined number of corners, and an opening cut in the side opposite to the display portion, said display portion being formed of a transparent material;
   a light-emitting assembly for emitting light through the display portion, the light-emitting assembly being housed in the casing and including at least one semiconductor light-emitting element provided with a light-emitting pattern;
   a reflector disposed between the light-emitting assembly and the display portion of the casing for guiding the light emitted from the semiconductor light-emitting element to the display portion;
   a resin layer sealing the gap between the light-emitting assembly and the casing near the opening for protecting the semiconductor light-emitting element from the external environment;
   partition means mounted to the bottom wall for isolating a first space including at least one corner of the casing from a second space around said display portion; and
   a resin reservoir formed by said partition means, the side walls of the casing, and the bottom wall of the casing for storing resin flowing toward said display portion through the corners of the casing when sealing the gap between the light-emitting assembly and the casing with said resin layer whereby flowing resin is prevented from reaching the display portion of the semiconductor light-emitting display device.

2. The device according to claim 1, wherein the partition means includes partition walls mounted to the the bottom wall, and said resin reservoir is formed by the partition walls, the side walls of the casing, and the bottom wall of the casing.

3. The device according to claim 2, wherein the casing is rectangular in cross section and the resin reservoir defined by the partition walls and walls of the casing covers at four corner portions of the casing.

4. The device according to claim 3, wherein the partition means is constituted by two partition walls each involved in forming a single resin reservoir covering two corner portions of the casing.

5. The device according to claim 3, wherein the partition means is constituted by four partition walls each involved in forming a single resin reservoir covering one corner portion of the casing.

6. The device according to claim 5, wherein the resin reservoir defined by the partition wall and walls of the casing is triangular in cross section.

7. The device according to claim 5, wherein the resin reservoir defined by the partition wall and walls of the casing is rectangular in cross section.

* * * * *